(12) United States Patent
Matsuda

(10) Patent No.: US 7,265,400 B2
(45) Date of Patent: Sep. 4, 2007

(54) SEMICONDUCTOR DEVICE INCLUDING FIELD-EFFECT TRANSISTOR USING SALICIDE (SELF-ALIGNED SILICIDE) STRUCTURE AND METHOD OF FABRICATING THE SAME

(75) Inventor: Satoshi Matsuda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 248 days.

(21) Appl. No.: 10/917,405

(22) Filed: Aug. 13, 2004

(65) Prior Publication Data

US 2005/0067665 A1 Mar. 31, 2005

(30) Foreign Application Priority Data

Sep. 19, 2003 (JP) ............................. 2003-327653

(51) Int. Cl.
*H01L 29/76* (2006.01)
*H01L 29/94* (2006.01)
*H01L 31/113* (2006.01)
*H01L 31/119* (2006.01)

(52) U.S. Cl. ...................... 257/288; 257/408; 257/377; 257/382; 257/384; 257/412; 257/413

(58) Field of Classification Search .............. 257/288, 257/408, 377, 382, 384, 388, 412, 413
See application file for complete search history.

(56) References Cited

U.S. PATENT DOCUMENTS 6,777,759 B1 * 8/2004 Chau et al. ................. 257/377

FOREIGN PATENT DOCUMENTS

JP 11-8387 1/1999

* cited by examiner

*Primary Examiner*—Sara Crane
*Assistant Examiner*—Samuel A. Gebremariam
(74) *Attorney, Agent, or Firm*—Oblon, Spivak, McClelland, Maier & Neustadt, P.C.

(57) ABSTRACT

An element isolation region for electrically isolating an element region where an element is to be formed is formed in a semiconductor substrate. A gate insulating film is formed on the semiconductor substrate in the element region. A gate electrode is formed on the gate insulating film. Source/drain regions are formed to be separated from each other in a surface region of the semiconductor substrate. The source/drain regions sandwich a channel region formed below the gate insulating film. Gate sidewall films are formed on the two side surfaces of the gate electrode. Silicide films are formed on the source/drain regions so as to be separated from the element isolation region.

8 Claims, 4 Drawing Sheets

SEMICONDUCTOR DEVICE INCLUDING FIELD-EFFECT TRANSISTOR USING SALICIDE (SELF-ALIGNED SILICIDE) STRUCTURE AND METHOD OF FABRICATING THE SAME

CROSS-REFERENCE TO RELATED APPLICATIONS

This application is based upon and claims the benefit of priority from prior Japanese Patent Application No. 2003-327653, filed Sep. 19, 2003, the entire contents of which are incorporated herein by reference.

BACKGROUND OF THE INVENTION

1. Field of the Invention

The present invention relates to a semiconductor device including a field-effect transistor using a salicide (self-aligned silicide) structure and a method of fabricating the same.

2. Description of the Related Art

A transistor using a salicide structure is a structure most often used as a method of reducing the parasitic resistance on a contact junction or gate electrode (e.g., Jpn. Pat. Appln. KOKAI Publication No. 11-8387).

A salicide structure is as follows. As shown in FIG. 1, after a gate electrode 101 is formed, an insulating film such as an oxide film which does not react with a silicide material is left behind as a gate sidewall film 102 on the side surface of the gate electrode 101. On this structure, a metal film for forming a silicide is formed. The silicon and metal are caused to react with each other by heat, thereby forming silicide films 104 in self-alignment on exposed source/drain regions 103.

Recently, the advance of the scaling (downsizing) of devices makes it necessary to shallow contact junctions (to form shallow junctions). However, it is difficult to scale the silicide reaction layer itself, and this is one cause which interferes with the scaling of source/drain regions. Especially in portions of an element region(active region) near the edges of an element isolation region 105 using STI (Shallow Trench Isolation), it is difficult to control ion implantation or diffusion to the same depth as a flat portion separated from the edges. This deteriorates the margin to a junction leak on the junction surfaces between the source/drain regions 103 and a semiconductor substrate 106 when a salicide structure is formed.

BRIEF SUMMARY OF THE INVENTION

According to one aspect of the present invention, a semiconductor device comprises an element isolation region formed in a semiconductor substrate to electrically isolate an element region where an element is to be formed; gate insulating films formed on the semiconductor substrate in the element region; a gate electrode formed on the gate insulating film; source/drain regions formed to be separated from each other in a surface region of the semiconductor substrate, the source/drain regions sandwiching a channel region formed below the gate insulating film; a gate sidewall film formed on two side surfaces of the gate electrode; and silicide films formed on the source/drain regions so as to be separated from the element isolation region.

According to another aspect of the present invention, a semiconductor device fabrication method comprises forming, in a semiconductor substrate, an element isolation region for defining an element region where an element is to be formed; forming a gate insulating film on the semiconductor substrate in the element region; forming a gate electrode on the gate insulating film; forming extension regions in a surface region of the semiconductor substrate on two sides of the gate electrode; forming gate sidewall films on two side surfaces of the gate electrode; forming source/drain regions in a surface region of the semiconductor substrate outside the gate sidewall films; forming a metal film on the gate electrode, gate sidewall film, and source/drain regions; removing the metal film by anisotropic etching such that the metal films separated from the element isolation region remains only on side surfaces of the gate sidewall films; and silicifying the metal films remaining on the source/drain regions to form silicide films, separated from the element isolation region, on the source/drain regions.

DETAILED DESCRIPTION OF THE INVENTION

Figure 1:
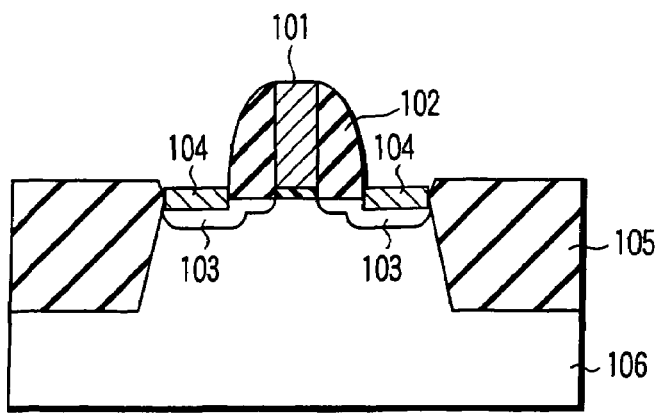
FIG. 1 is a sectional view showing the structure of a conventional MOS field-effect transistor (to be referred to as a MOSFET hereinafter)

Embodiments of the present invention will be described below with reference to the accompanying drawing. In the following explanation, the same reference numerals denote the same parts throughout the drawing.

FIRST EMBODIMENT

First, a MOS field-effect transistor (to be referred to as a MOSFET hereinafter) as a semiconductor device of the first embodiment of the present invention will be described below.

Figure 2:
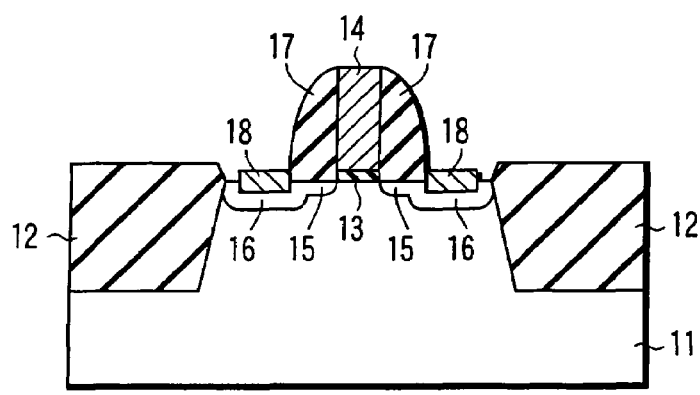
FIG. 2 is a sectional view showing the structure of a MOSFET of the first embodiment of the present invention.
Figure 3:
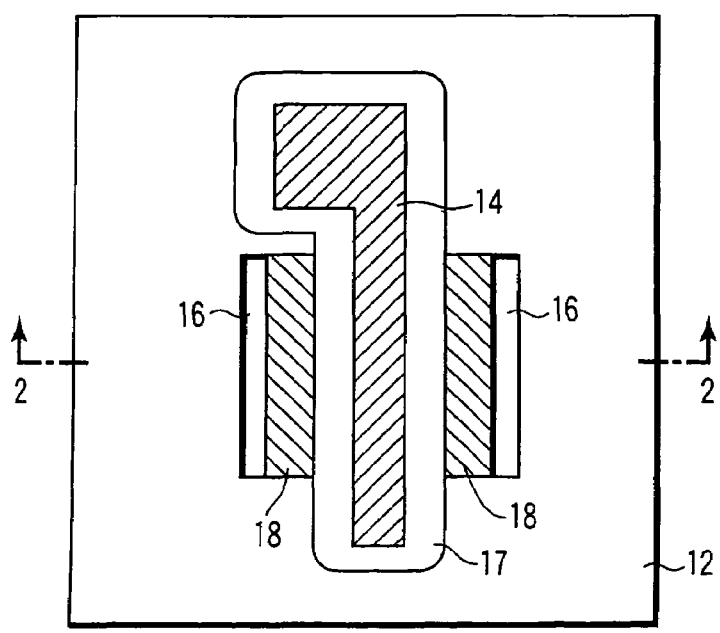
FIG. 3 is a plan view of a MOSFET of the first embodiment of the present invention.

FIG. 2 is a sectional view showing the structure of the MOSFET of the first embodiment. FIG. 3 is a plan view of the MOSFET. FIG. 2 shows a sectional structure taken along a line 2-2 in FIG. 3.

As shown in FIG. 2, an element isolation region 12 and an element region surrounded by the element isolation region 12 are formed on a silicon semiconductor substrate 11. The element region is a region where an element (in this embodiment, a MOSFET) is to be formed, and is electrically insulated by the element isolation region 12. A gate insulating film 13 is formed on the semiconductor substrate 11 in this element region, and a gate electrode 14 is formed on the gate insulating film 13.

In addition, extension regions 15 and source/drain regions 16 are so formed as to sandwich a channel region formed on the semiconductor substrate 11 below the gate insulating film 13. The extension regions 15 are made of shallow diffusion layers having a conductivity type opposite to that of the semiconductor substrate 11. The source/drain regions 16 are made of diffusion layers having a conductivity type opposite to that of the semiconductor substrate 11 and deeper than the extension regions 15. A gate sidewall insulating film 17 is formed on the two side surfaces of the gate electrode 14. Furthermore, on the source/drain regions 16 outside the gate sidewall insulating film 17, silicide films 18 are formed away from the element isolation region 12.

In this MOSFET as shown in FIG. 2, the source/drain regions 16 near the element isolation region 12 are formed shallow from the substrate surface. That is, the p-n junction surfaces formed between the semiconductor substrate 11 and source/drain regions 16 are shallow from the substrate surface. In the MOSFET having this structure shown in FIG. 2, the silicide films 18 are formed away from the edges of the element isolation region 12. Since the silicide films 18 are not formed in the shallow portions of the source/drain regions 16 near the element isolation region 12, a junction leak current produced on the p-n junction surfaces between the semiconductor substrate 11 and source/drain regions 16 can be reduced. That is, this MOSFET can increase the junction leak margin in the shallow portions of the contact junction layers.

This will be explained with reference to the plan view of FIG. 3. The silicide layers 18 are formed along the gate sidewall insulating film 17, and are not in contact with the element isolation region 12 in the gate longitudinal direction. In other words, in regions in which the element isolation region 12 and source/drain regions 16 are in contact with each other and which are parallel to a gate line, the silicide films 18 are formed away from the element isolation region 12. Therefore, the silicide films 18 are not formed in those regions near the element isolation region 12, in which the p-n junction surfaces between the semiconductor substrate 11 and source/drain regions 16 are shallow.

Accordingly, the distance between the bottom surfaces of the silicide films 18 and the p-n junction surfaces can be ensured, and an increase in junction leak current on the p-n junction surfaces can be suppressed.

In the first embodiment as described above, no salicide film is formed near the edges of an element isolation insulating film; salicide films are formed away from those edges of the element isolation insulating film, in which the junction depth of diffusion layers forming source/drain regions may be small. This makes it possible to well increase the distance between the salicide film bottom surfaces and the junction surfaces (the boundary surfaces between the source/drain regions and substrate). As a consequence, a MOSFET having a large junction leak margin can be formed.

A method of fabricating the MOSFET of the first embodiment will be described below. FIGS. 4 to 8 are sectional views showing the steps of the method of fabricating the MOSFET of the first embodiment.

Figure 4:
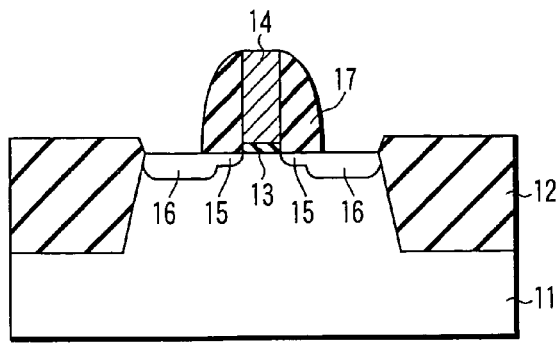
FIG. 4 is a sectional view showing the first step of a method of fabricating the MOSFET of the first embodiment of the present invention.

First, as shown in FIG. 4, an element isolation structure, a gate structure, a gate sidewall structure, and source/drain diffusion layers are formed by the conventional MOSFET formation process. Details are as follows. An element isolation region 12 is formed in a silicon semiconductor substrate 11, thereby forming an element region defined by the element isolation region 12. The element isolation region 12 is formed by, e.g., STI (Shallow Trench Isolation). The STI is a structure in which an insulating film such as a silicon oxide film is formed in a shallow trench of a substrate. A gate insulating film 13 is formed on the semiconductor substrate 11 in the element region, and a gate electrode 14 is formed on the gate insulating film 13. The gate insulating film 13 is made of, e.g., a silicon oxide film formed by thermal oxidation, and the gate electrode 14 is made of a polysilicon film.

Subsequently, the gate electrode 14 is used as a mask to dope an impurity having a conductivity type opposite to that of the semiconductor substrate 11 by ion implantation, thereby forming extension regions 15 in surface regions of the semiconductor substrate 11 on the two sides of the gate electrode 14. In addition, an insulating film such as a silicon oxide film or silicon nitride film is formed on the structure, and removed by anisotropic etching such as RIE, thereby forming a gate sidewall insulating film 17 on the two side surfaces of the gate electrode 14. The gate electrode 14 and gate sidewall insulating film 17 are used as masks to dope an impurity having the conductivity type opposite to that of the semiconductor substrate 11 by ion implantation, thereby forming source/drain regions 16 in the surface regions of the semiconductor substrate 11 outside the gate sidewall insulating film 17. As described earlier, the extension regions 15 are made of shallow diffusion layers, and the source/drain regions 16 are made of diffusion layers deeper than the extension regions 15.

Figure 5:
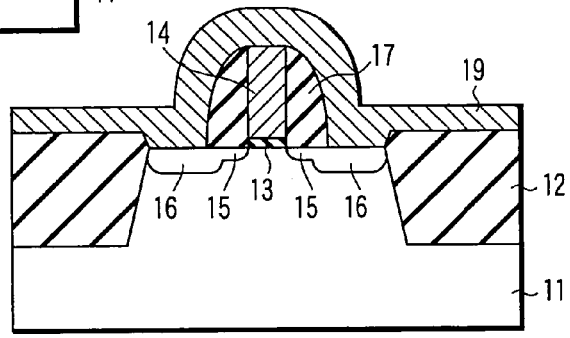
FIG. 5 is a sectional view showing the second step of the method of fabricating the MOSFET of the first embodiment of the present invention.

As shown in FIG. 5, a metal film 19 for forming a salicide is formed by sputtering or CVD on the structure shown in FIG. 4. Examples of the metal film for forming a salicide are cobalt (Co), nickel (Ni), titanium (Ti), and a stacked film of these metals.

Figure 6:
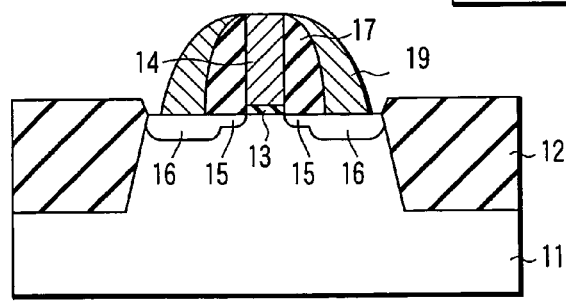
FIG. 6 is a sectional view showing the third step of the method of fabricating the MOSFET of the first embodiment of the present invention.

As shown in FIG. 6, the metal film 19 is removed by anisotropic etching such as RIE so as to be left behind only on the two side surfaces of the gate sidewall insulating film 17. The metal film 19 is not in contact with the element isolation region 12, but is separated from the element isolation region 12 by a predetermined distance.

Figure 7:
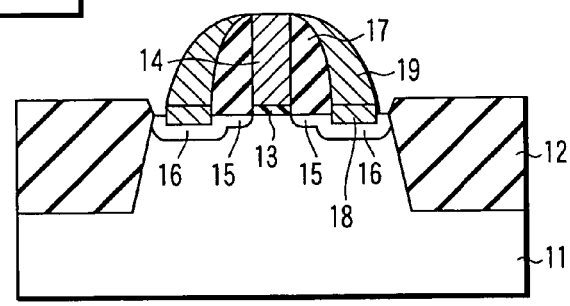
FIG. 7 is a sectional view showing the fourth step of the method of fabricating the MOSFET of the first embodiment of the present invention.

Then, the semiconductor substrate having the structure shown in FIG. 6 is annealed to form a salicide. Consequently, the silicon forming the source/drain regions 16 and the element forming the metal film 19 react with each other to silicify the metal film 19 on the source/drain regions 16. In this manner, as shown in FIG. 7, silicide films 18 are formed on the source/drain regions 16.

Figure 8:
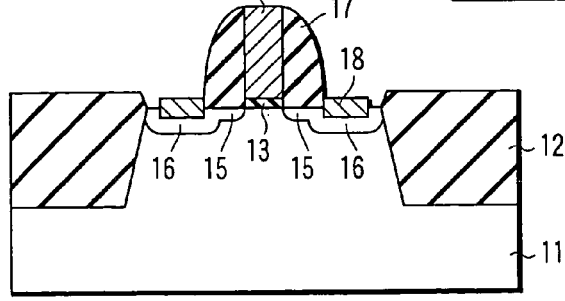
FIG. 8 is a sectional view showing the fifth step of the method of fabricating the MOSFET of the first embodiment of the present invention.

After that, the unreacted portion of the metal film 19 is selectively etched away by using, e.g., a hot sulfuric acid/hydrogen peroxide aqueous solution (SH) which is a mixture of sulfuric acid and an aqueous hydrogen peroxide solution. As a consequence, as shown in FIG. 8, the silicide films 18 are left behind on the source/drain regions 16 so as to be separated from the edges of the element isolation region 12 and extended along the gate sidewall insulating film 17.

In the above fabrication method, after a metal film for forming a silicide is formed on the entire surface, anisotropic etching such as RIE is performed to leave the metal film, separated from the element isolation region (e.g., STI), only in the vicinities of the gate sidewall film. When salicide formation is performed in the subsequent annealing step, therefore, silicide films can be formed in self-alignment only in the vicinities of the gate sidewall film, and no silicide film is formed near the element isolation region. Consequently, in the MOSFET formed by the above fabrication method, a junction leak current produced on the p-n junction surfaces of diffusion layers forming the source/drain regions can be reduced.

SECOND EMBODIMENT

A MOS field-effect transistor (MOSFET) as a semiconductor device of the second embodiment of the present invention will be described below.

Figure 9:
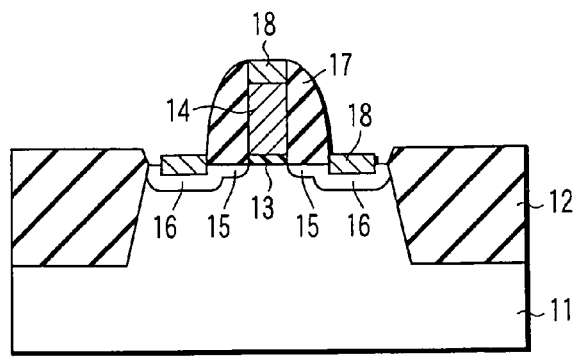
FIG. 9 is a sectional view showing the structure of a MOSFET of the second embodiment of the present invention.

FIG. 9 is a sectional view showing the structure of the MOSFET of the second embodiment. As shown in FIG. 9, a silicide film 18 is formed on a gate electrode 14. The rest of the structure is the same as the first embodiment. In this MOSFET, the wiring resistance in the gate electrode can be reduced, so the device characteristics can be improved.

A method of fabricating the MOSFET of the second embodiment will be explained below. FIGS. 10 to 15 are sectional views showing the steps of the method of fabricating the MOSFET of the second embodiment.

Figure 10:
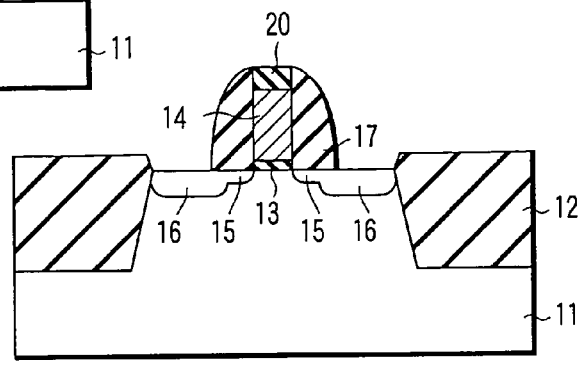
FIG. 10 is a sectional view showing the first step of a method of fabricating the MOSFET of the second embodiment of the present invention.

First, as shown in FIG. 10, an element isolation structure, a gate structure, a gate sidewall structure, and source/drain diffusion layers are formed by the conventional MOSFET formation process. When the gate structure is formed, a material with which an etching selective ratio to a gate sidewall insulating film 17 and element isolation region 12 is obtained in the subsequent steps is deposited on a gate electrode 14 and patterned simultaneously with the gate electrode 14, thereby forming a cap film 20. When a silicon oxide film, for example, is to be used as the gate sidewall insulating film 17 and element isolation region 12, a silicon nitride film is used as the material with which an etching selective ratio to the gate sidewall insulating film 17 and element isolation region 12 is obtained. The element isolation region 12, a gate insulating film 13, extension regions 15, the gate sidewall insulating film 17, and source/drain regions 16 are formed in the same manner as in the first embodiment.

Figure 11:
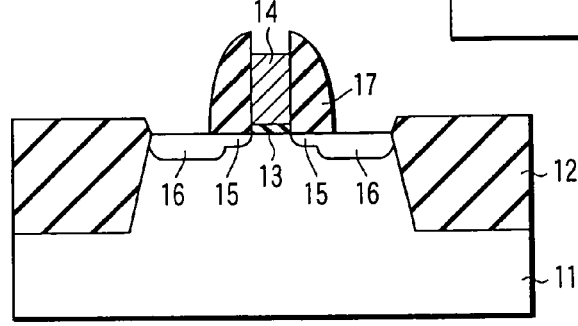
FIG. 11 is a sectional view showing the second step of the method of fabricating the MOSFET of the second embodiment of the present invention.
Figure 12:
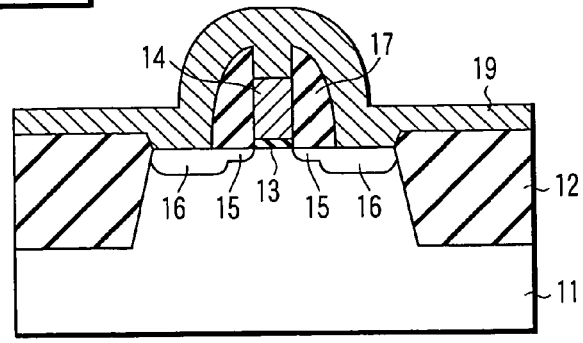
FIG. 12 is a sectional view showing the third step of the method of fabricating the MOSFET of the second embodiment of the present invention.

As shown in FIG. 11, only the cap film 20 on the gate electrode 14 is selectively removed. Subsequently, as shown in FIG. 12, a metal film 19 for forming a salicide is formed on the structure shown in FIG. 11 by, e.g., sputtering or CVD. Examples of the metal film for forming a salicide are cobalt (Co), nickel (Ni), titanium (Ti), and a stacked film of these metals.

Figure 13:
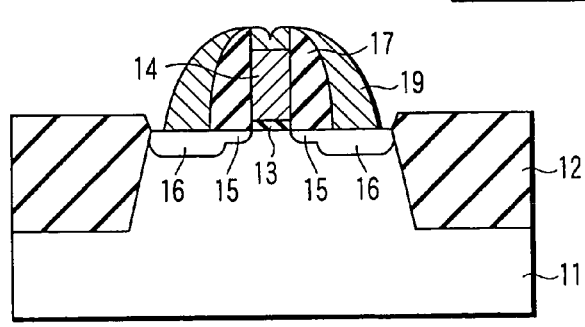
FIG. 13 is a sectional view showing the fourth step of the method of fabricating the MOSFET of the second embodiment of the present invention.

As shown in FIG. 13, the metal film 19 is removed by anisotropic etching such as RIE so as to be left behind only on the two side surfaces of the gate sidewall insulating film 17 and on the gate electrode 14. The metal film 19 is not in contact with the element isolation region 12, but is separated from the element isolation region 12 by a predetermined distance.

Figure 14:
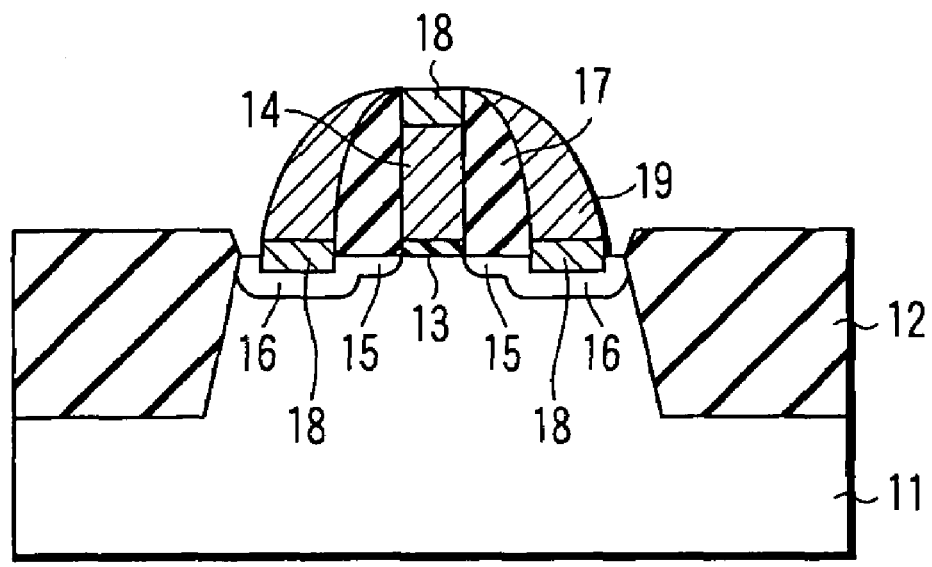
FIG. 14 is a sectional view showing the fifth step of the method of fabricating the MOSFET of the second embodiment of the present invention.

Then, the semiconductor substrate having the structure shown in FIG. 13 is annealed to form a salicide. Consequently, the silicon forming the source/drain regions (silicon substrate) 16 and gate electrode (polysilicon film) 14 and the element forming the metal film 19 react with each other to silicify the metal film 19 on the source/drain regions 16 and on the gate electrode 14. In this manner, as shown in FIG. 14, silicide films 18 are formed on the source/drain regions 16 and gate electrode 14.

Figure 15:
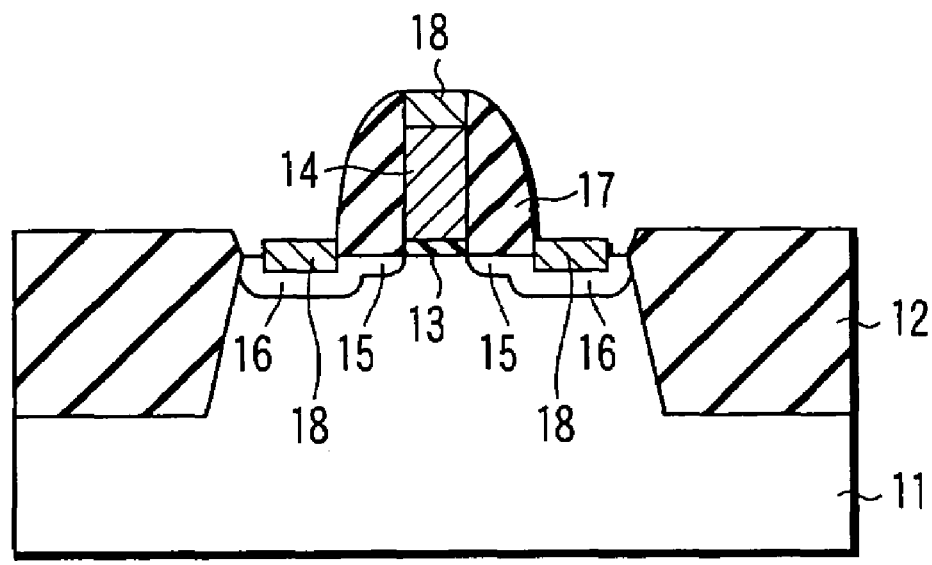
FIG. 15 is a sectional view showing the sixth step of the method of fabricating the MOSFET of the second embodiment of the present invention.

After that, the unreacted portion of the metal film 19 is selectively etched away by using, e.g., a hot sulfuric acid/hydrogen peroxide aqueous solution (SH) which is a mixture of sulfuric acid and an aqueous hydrogen peroxide solution. As a consequence, as shown in FIG. 15, the silicide films 18 are left behind on the source/drain regions 16 so as to be separated from the edges of the element isolation region 12 and extended along the gate sidewall insulating film 17. The silicide film 18 is also left behind on the gate electrode 14.

In the above fabrication method, a cap film formed on a gate electrode is removed after a gate sidewall insulating film is formed on the two side surfaces of the gate electrode and on the two side surfaces of the cap film. Subsequently, a metal film for forming a silicide is formed on the entire surface, and anisotropic etching such as RIE is performed. Consequently, the metal film remains in the vicinities of the gate'sidewall film so as to be separated from an element isolation region (e.g., STI), and also remains on the gate electrode. When salicide formation is performed in the subsequent annealing step, therefore, silicide films can be formed in self-alignment only on the source/drain regions near the gate sidewall film and on the gate electrode, and no silicide film is formed near the element isolation region. Consequently, in the MOSFET formed by the above fabrication method, a junction leak current produced on the p-n junction surfaces of diffusion layers forming the source/drain regions can be reduced. In addition, the wiring resistance of the gate electrode can be reduced.

In each embodiment of the present invention as described above, it is possible to provide a semiconductor device including a field-effect transistor having a salicide structure in which a large junction leak margin is obtained because a large distance can be ensured between the bottom surfaces of silicide films and the junction surfaces between source/drain regions and a semiconductor substrate, and to provide a method of fabricating the semiconductor device.

Note that each embodiment described above is of course applicable to both an n-channel MOS transistor and p-channel MOS transistor.

Note also that the above embodiments can be practiced not only singly but also in the form of an appropriate combination. Furthermore, the above embodiments include inventions in various stages, so these inventions in various stages can also be extracted by appropriately combining a plurality of constituent elements disclosed in the embodiments.

Additional advantages and modifications will readily occur to those skilled in the art. Therefore, the invention in its broader aspects is not limited to the specific details and representative embodiments shown and described herein.

Accordingly, various modifications may be made without departing from the spirit and scope of the general inventive concept as defined by the appended claims and their equivalents.

What is claimed is:

1. A semiconductor device comprising: an element isolation region formed in a semiconductor substrate to electrically isolate an element region where an element is to be formed; a gate insulating film formed on the semiconductor substrate in the element region; a gate electrode formed on the gate insulating film; source/drain regions formed to be separated from each other in a surface region of the semiconductor substrate, the source/drain regions sandwiching a channel region formed below the gate insulating film; gate sidewall films formed on two side surfaces of the gate electrode; and silicide films formed on the source/drain regions so as to be separated from the element isolation region in a section parallel to a channel length direction, wherein the silicide films extend from the gate sidewall film in the channel length direction and a channel width direction toward the element isolation region, the silicide films do not contact the element isolation region on the source/drain regions in the section parallel to the channel length direction, and the silicide films contact the element isolation region in a section parallel to the channel width direction.

2. The device according to claim 1, wherein the silicide films are formed in contact with side surfaces of the gate sidewall films.

3. The device according to claim 1, wherein the silicide films contain one of cobalt (Co), nickel (Ni), and titanium (Ti).

4. The device according to claim 1, wherein the element isolation region is made of STI (Shallow Trench Isolation) formed by burying an insulating film in a trench formed in the semiconductor substrate.

5. The device according to claim 1, wherein the silicide films contact the source/drain regions formed in the surface region of the semiconductor substrate.

6. A semiconductor device comprising: an element isolation region formed in a semiconductor substrate to electrically isolate an element region where an element is to be formed; a gate insulating film formed on the semiconductor substrate in the element region; a gate electrode formed on the gate insulating film; a first silicide film formed on the gate electrode; source/drain regions formed to be separated from each other in a surface region of the semiconductor substrate, the source/drain regions sandwiching a channel region formed below the gate insulating film; gate sidewall films formed on two side surfaces of the gate electrode and on two side surfaces of the first silicide film; and second silicide films formed on the source/drain regions so as to be separated from the element isolation region in a section parallel to a channel length direction, wherein the second silicide films extend from the gate sidewall film in the channel length direction and a channel width direction toward the element isolation region, the second silicide films do not reach the element isolation region on the source/drain regions in the section parallel to the channel length direction, and the second silicide films contact the element isolation region in a section parallel to the channel width direction.

7. The device according to claim 6, wherein the first silicide film is formed in contact with side surfaces of the gate sidewall films.

8. The device according to claim 6, wherein the second silicide films contact the source/drain regions formed in the surface region of the semiconductor substrate.

* * * * *